(12) United States Patent
    Voegeli

(10) Patent No.: US 8,294,543 B2
(45) Date of Patent: Oct. 23, 2012

(54) CONFINED FIELD MAGNET SYSTEM AND METHOD

(76) Inventor: Otto Voegeli, Kreuzlingen (CH)

( * ) Notice: Subject to any disclaimer, the term of this patent is extended or adjusted under 35 U.S.C. 154(b) by 0 days.

(21) Appl. No.: 13/458,535

(22) Filed: Apr. 27, 2012

(65) Prior Publication Data

US 2012/0212310 A1    Aug. 23, 2012

Related U.S. Application Data

(62) Division of application No. 12/128,474, filed on May 28, 2008, now Pat. No. 8,179,220.

(51) Int. Cl.
    *H01F 1/00* (2006.01)
    *H01F 3/00* (2006.01)
(52) U.S. Cl. .................. 335/296; 335/216; 324/318
(58) Field of Classification Search .......... 335/216, 335/296–299, 302–306; 324/318–320
    See application file for complete search history.

(56) References Cited

U.S. PATENT DOCUMENTS

| 3,237,059 A | 2/1966 | Meyerer |
| 4,647,887 A | 3/1987 | Leupold |
| 4,937,545 A | 6/1990 | Chaillout et al. |
| 4,999,600 A | 3/1991 | Aubert |
| 5,319,339 A | 6/1994 | Leupold |
| 5,347,252 A | 9/1994 | Ries |
| 5,576,679 A | 11/1996 | Ohashi et al. |
| 6,147,578 A | 11/2000 | Panfil et al. |
| 6,909,347 B2 | 6/2005 | Wakuda et al. |
| 7,176,386 B1 | 2/2007 | Aidam et al. |

FOREIGN PATENT DOCUMENTS

FR    2562785 A    10/1985

*Primary Examiner* — Bernard Rojas
(74) *Attorney, Agent, or Firm* — Kenyon & Kenyon LLP

(57) ABSTRACT

A system and method of generating a magnetic field that is uniform in magnitude and direction may generally restrict the field from expanding away from a longitudinal axis. In some instances, such a magnetic field may be controllable in magnitude and direction. In accordance with some embodiments, a generated magnetic field may be selectively confined to a predetermined three-dimensional space.

30 Claims, 13 Drawing Sheets

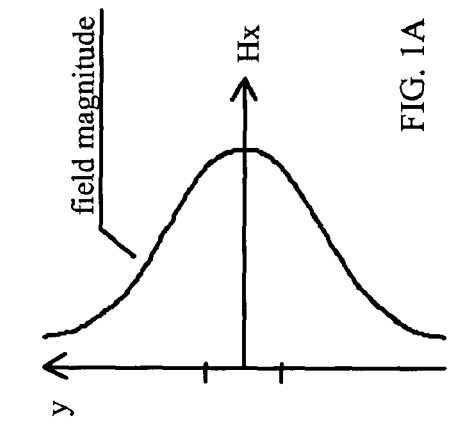
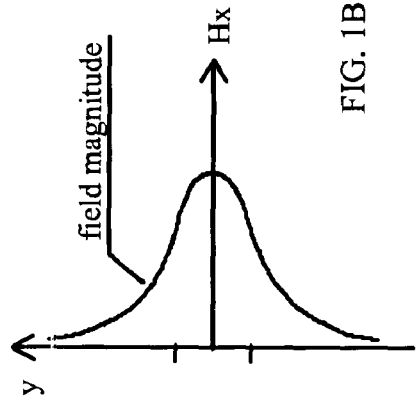
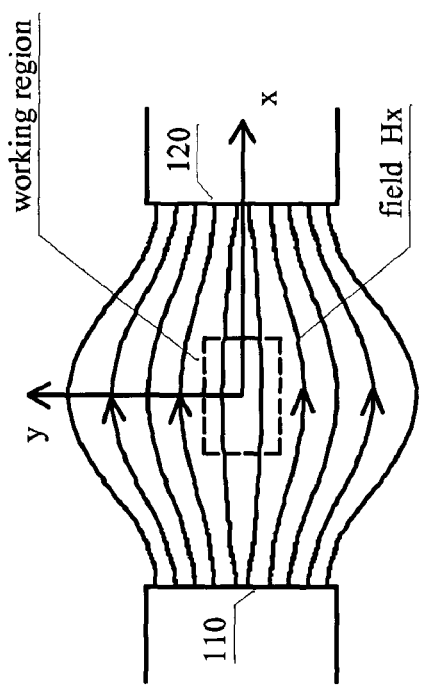
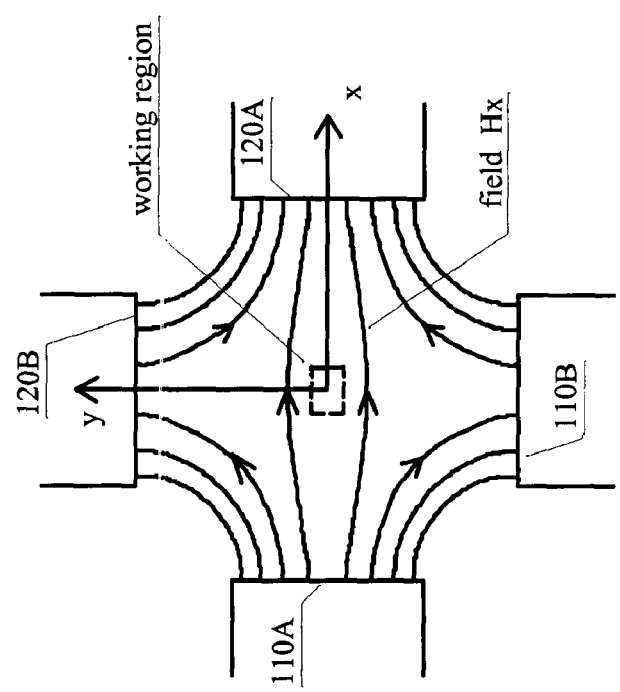
FIG. 1A FIG. 1B
PRIOR ART
FIG. 1

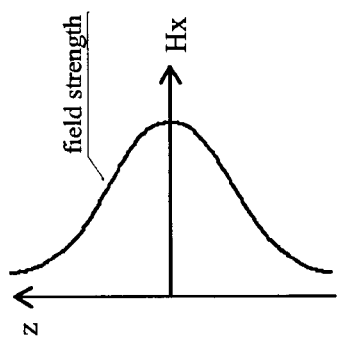
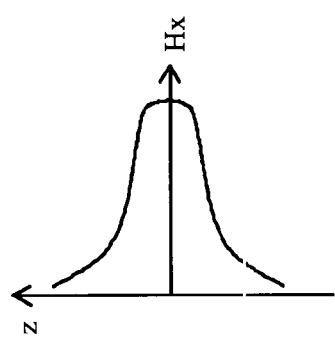
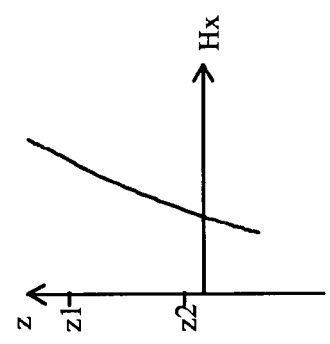
FIG. 9A
FIG. 9B
FIG. 9C
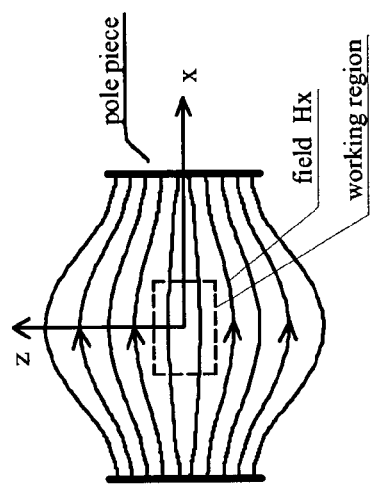
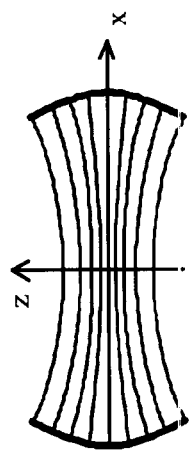
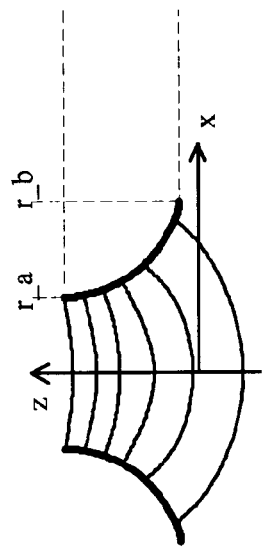
FIG. 9

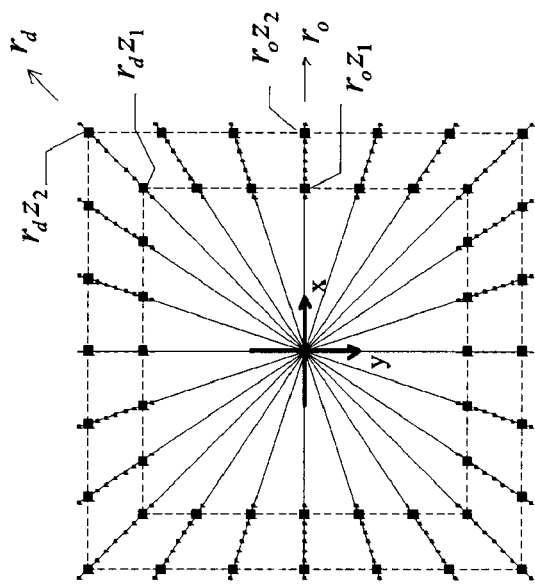
FIG. 10C
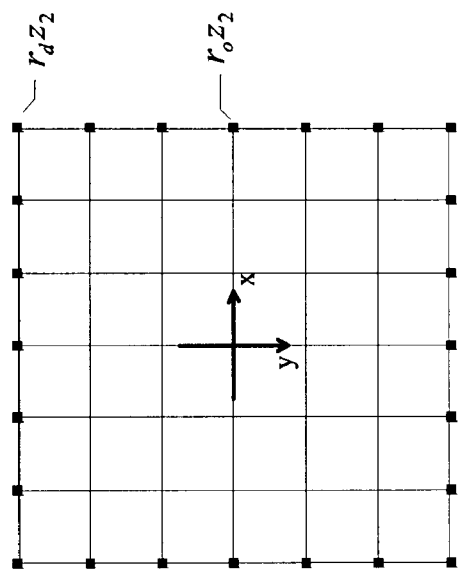
FIG. 10B
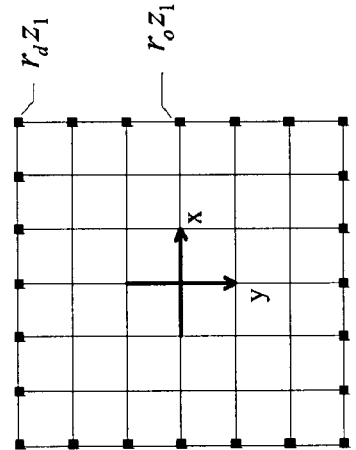
FIG. 10A
FIG. 10

CONFINED FIELD MAGNET SYSTEM AND METHOD

CROSS-REFERENCE TO RELATED APPLICATION

This application is a divisional of and claims the benefits of U.S. patent application Ser. No. 12/128,474 filed May 28, 2008, now issued as U.S. Pat. No. 8,179,220. The foregoing application is hereby incorporated in entirety herein by reference.

BACKGROUND

1. Field of the Invention

Aspects of the present invention relate generally to generation and maintenance of electromagnetic fields, and more particularly to a system and method of generating and confining magnetic fields that are uniform and controllable in magnitude and direction.

2. Description of Related Art

In many situations, it may be useful to apply a uniform magnetic field over some region of space, for example, to perform certain tests or to obtain measurements with respect to operation of an electronic device containing a magnetic component. A common requirement for systems employing magnetic fields for testing or measuring purposes is that the applied field be uniform in magnitude and direction over the entire expanse of the working region; in many applications, it may be desirable that the field also be controllable in magnitude and direction. In some instances, it is desirable that the magnetic field be nonexistent outside the working region, i.e., the boundaries of the working region define the extent of the magnetic field. Conventional systems generally fail to satisfy these and other requirements.

Magnetic fields may be generated, for example, using current conducting coils. Some traditional attempts at generating nearly uniform magnetic fields have employed so-called "Helmholtz coils," which are operative to superpose the fields from a pair of picture-frame coils. In practice, field uniformity at the center is best when the coils are separated by a distance approximately equal to the coil radius. Using Helmholtz coils, a reasonably uniform field may be approximated within a central region of the coil pair; the attainable field strength is typically less than 100 Oe. In that regard, Helmholtz coils are useful only for generating fields of low magnitude within an unobstructed environment. Bi-axial fields, which also allow for control of field direction, may be generated using two orthogonal pairs of Helmholtz coils. Compared to their large size, such Helmholtz systems can provide only relatively low field magnitudes as noted above. To generate fields of larger magnitude using traditional technologies, it is generally necessary to sacrifice the degree of field uniformity provided by Helmholtz coils; some systems employ electromagnets in which magnetic flux is channeled through a low-reluctance yoke to a pair of opposed pole pieces. While such electromagnets can be implemented to provide fields of much larger magnitudes than Helmholtz coils, electromagnets typically suffer from significant inefficiencies, and generally do not provide the same degree of field uniformity as is attainable with Helmholtz coils.

FIG. 1A is a simplified diagram illustrating a magnetic field generated by a prior art uni-axial electromagnet system, and FIG. 1B is a simplified diagram illustrating a magnetic field generated by a prior art bi-axial electromagnet system. The illustrations in FIGS. 1A and 1B depict, for each system, the directional configuration of a magnetic field generated between pole pieces of the respective magnet system, as well as the associated distribution of field magnitude. The illustrations also indicate a "working region" in which field magnitude and direction are sufficiently uniform to satisfy typical testing or measurement applications performed by such systems.

FIG. 1A illustrates characteristic degradation of field uniformity in a uni-axial electromagnet as caused by the field bulging from a (central) longitudinal x-axis between a pair of pole pieces 110 and 120. The lack of field uniformity generally limits the useable working region to be substantially smaller than the space between pole pieces 110, 120. This adversely affects size, power consumption, frequency of operation, and manufacturing cost of the system employed to generate the field.

Referring now to FIG. 1B, bi-axial fields may be generated with electromagnets by orthogonally superposing the fields from two uni-axial arrangements. This illustration shows the configuration of a magnetic field generated along the x-axis by a first uni-axial arrangement; a second, substantially identical uni-axial arrangement rotated by 90 degrees relative to the first arrangement, generates a second magnetic field component along the y-axis. In each uni-axial arrangement, magnetic flux is channeled through a low-reluctance yoke to a pair pole pieces (110A and 120A, on the one hand, and 110B and 120B, on the other hand). In this case, field uniformity is further impaired because the field, Hx, from one uni-axial system comprising pole pieces 110A and 120A is shunted by the pole pieces 110B and 120B from the other uni-axial system as indicated in the drawing figure. As a result, the useable working region is typically very small as compared to the distance between pole pieces. Power consumption, frequency of operation, and manufacturing cost are adversely affected in bi-axial systems worse than with typical uni-axial systems.

SUMMARY

Embodiments of the present invention overcome the above-mentioned and various other shortcomings of conventional technology, providing a system and method of generating a magnetic field that is uniform in magnitude and direction by restricting the field from expanding away from a longitudinal axis. In some instances, such a magnetic field may be controllable in magnitude and direction. In accordance with some embodiments, a generated magnetic field may be selectively confined to a predetermined three-dimensional space.

In accordance with one aspect, embodiments of the invention may facilitate generation of magnetic fields that are uniform in magnitude and direction.

In accordance with another aspect, bi-axial embodiments of the invention may facilitate generation of magnetic fields that are controllable in magnitude and direction while exhibiting substantial uniformity.

In accordance with another aspect, embodiments of the invention may provide a field space having a cross-section that is an arbitrary design choice.

In accordance with another aspect, embodiments of the invention may facilitate generation of uniform fields that extend only over a defined field space; in some implementations, the shape of the field may be manipulated in accordance with an application with which the field is used.

In accordance with another aspect, embodiments of the invention may generate uniform magnetic fields with improved efficiency.

BRIEF DESCRIPTION OF THE DRAWING FIGURES

FIG. 1A is a simplified diagram illustrating a magnetic field generated by a prior art uni-axial electromagnet system.

FIG. 1B is a simplified diagram illustrating a magnetic field generated by a prior art bi-axial electromagnet system.

FIGS. 9A-9C are simplified diagrams illustrating various embodiments of pole face profiles.

FIGS. 10A-10C are simplified diagrams illustrating an arrangement of pole faces in one embodiment of a bi-axial magnet employing poles faces having convex profiles.

DETAILED DESCRIPTION

Figure 2:
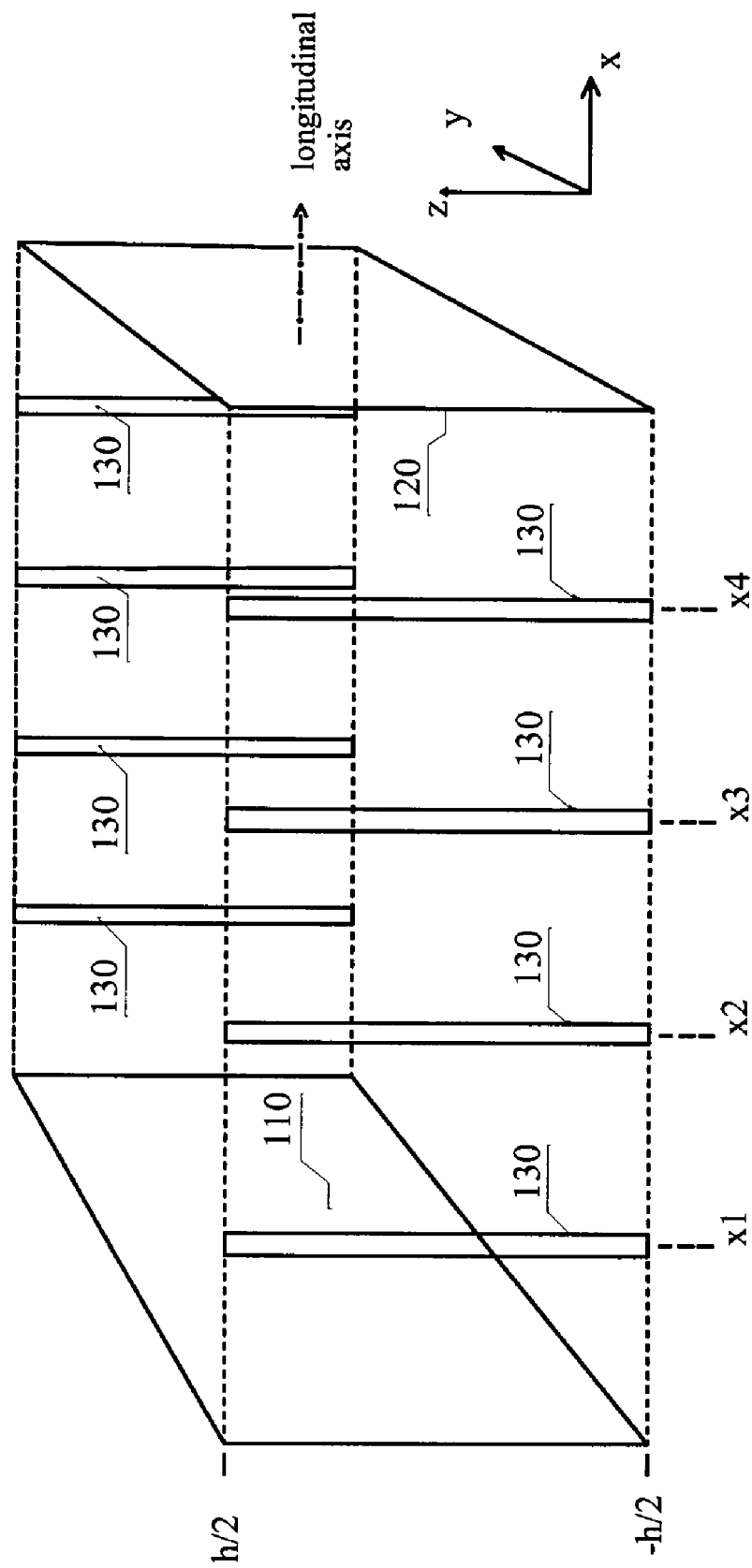
FIG. 2 is a simplified conceptual diagram illustrating one embodiment of a uni-axial magnet configured to provide a partially enclosed field space.

As set forth in detail below, embodiments of the invention generally comprise an electromagnet that produces a magnetic field within an enclosed space (i.e., the field may be confined to a predetermined three-dimensional space). Confinement may be achieved by controlling the values of magnetostatic potential supplied to a collection of pole faces. In some embodiments, a method of generating a collection of magnetostatic potential values to supply to the pole faces may generally comprise connecting the pole faces to a common yoke that carries a segmented drive coil. While this approach may have particular utility in some applications, and may exhibit superior efficiency characteristics in some instances, it will be appreciated that other configurations may also be employed as a matter of design choice or otherwise taking into consideration performance, cost, and manufacturing practicalities. A uni-axial implementation may produce a magnetic field that is substantially uniform within a region enclosed by boundaries defining the field space. Similarly, a bi-axial implementation may produce a magnetic field that is both substantially uniform as well as controllable in magnitude and direction within a region enclosed by boundaries as set forth herein.

To generate a uniform magnetic field within a particular field space, a suitable method or mechanism of confinement is generally desirable. In accordance with some embodiments, such confinement may be achieved utilizing a "field fence" comprising a plurality of pole faces, each at an assigned, predetermined, or dynamically adjusted magnetostatic potential. In the context of the present disclosure, such a field fence may be employed to provide either full or partial enclosure of the field space. In particular, a collection of pole faces may be selectively distributed along the course of a boundary (like fence posts), creating a boundary surface of the field space. Each respective pole face may be supplied with a controlled magnetostatic potential. In accordance with one embodiment, the value of a respective magnetostatic potential that is provided to a respective pole face may be selected to be identical to that which would exist at the location of that respective pole face if a uniform field extended over all space (i.e., a theoretical value based upon the location of the respective pole face relative to other pole faces and assuming a perfectly uniform field).

Selectively or controllably supplying such magnetostatic potentials to each respective one of a plurality of pole faces may facilitate creating the boundary condition for a uniform field existing within a confined space defined by the pole faces. It is noted that imposing conditions at discrete locations may generally only approximate the continuously varying potential along a uniform field. Distortions of field uniformity as a result of this approximation may depend on the number and relative locations of pole faces along the boundary, as well as on the values of the magnetostatic potentials supplied to each, or a combination of these and other factors. In many implementations, distortions in field uniformity resulting from use of a plurality of discrete pole faces are surprisingly small, and are generally noticeable only at areas within the field space close to the pole faces.

Confining a Uni-Axial Field

Figure 3:
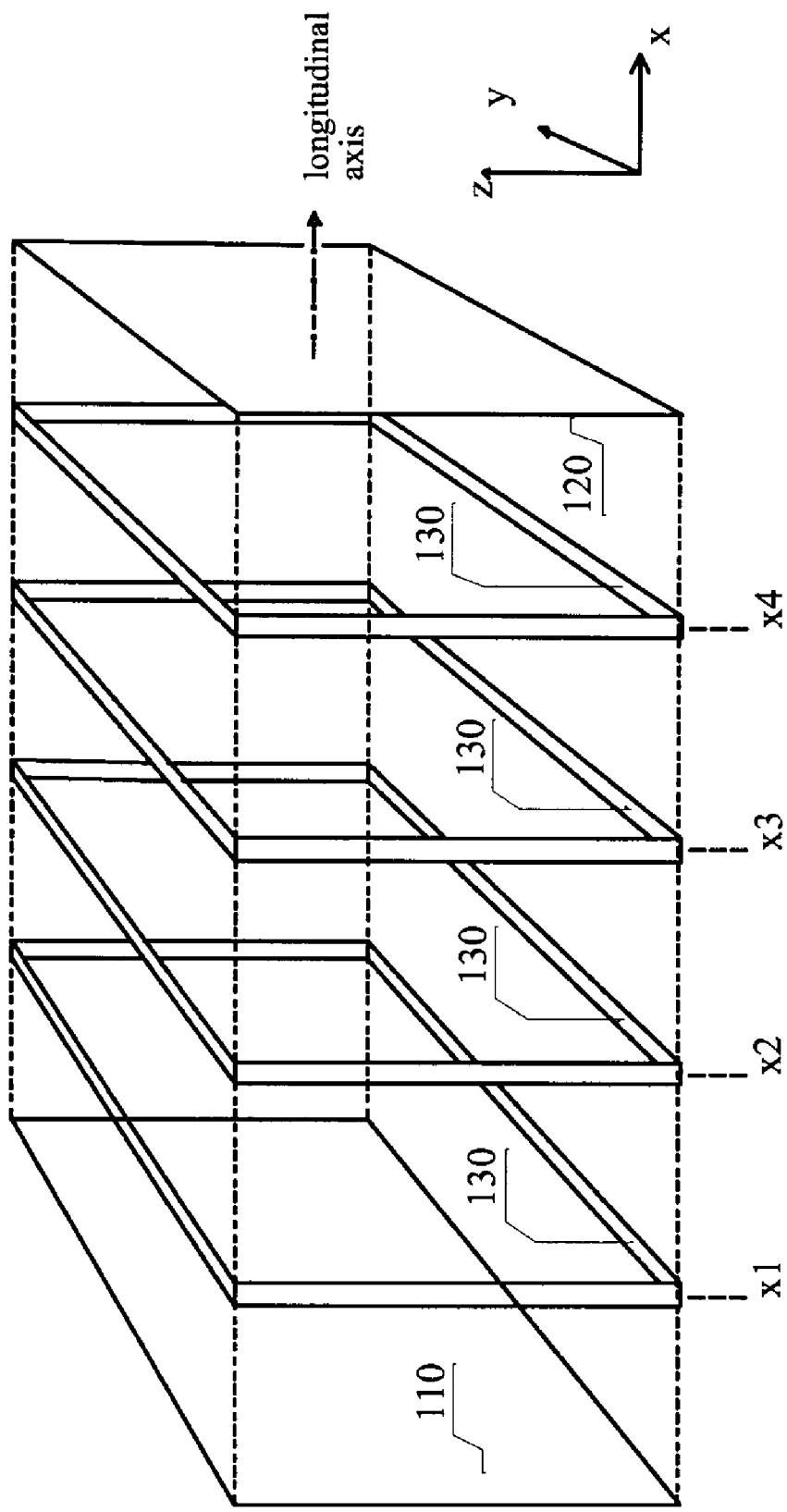
FIG. 3 is a simplified conceptual diagram illustrating one embodiment of a uni-axial magnet configured to provide a fully enclosed field space.

FIG. 2 is a simplified conceptual diagram illustrating one embodiment of a uni-axial magnet configured to provide a partially enclosed field space, and FIG. 3 is a simplified conceptual diagram illustrating one embodiment of a uni-axial magnet configured to provide a fully enclosed field space.

Both FIGS. 2 and 3 illustrate a uni-axial field space defined by substantially planar longitudinal boundaries, i.e., two opposed longitudinal pole faces 110 and 120, each of which may be oriented substantially normal to the longitudinal axis. As set forth below, it may be desirable in some instances that longitudinal pole faces 110 and 120 do not define substantially planar boundary surfaces. Lateral boundaries of the field space may be defined by surfaces aligned parallel to the longitudinal axis. These boundary surfaces are generally coincident with a plurality of lateral pole faces 130, each respective one of which may have a profile in a respective plane that is normal to the longitudinal axis; this respective plane also marks the longitudinal position (denoted x1, x2, . . . x4 in FIG. 2) of the respective lateral pole face. Physically, each respective lateral pole face 130 may be shaped with a given profile; in this context, the term "profile" generally refers to the line of intersection between a lateral pole face 130 and the plane marking its longitudinal position.

The profiles for all respective lateral pole faces 130 generally circumscribe the lateral cross-section of the field space. In accordance with some embodiments, these profiles may be selected to align with a contour associated with the boundary surfaces defined by longitudinal pole faces 110 and 120. In this context, a "contour" generally refers to a two dimensional (in the y and z dimensions) shape of longitudinal pole faces, which are oriented substantially normal to the longitudinal axis.

FIG. 2 shows a field space that is only partially enclosed. As indicated in the figure, longitudinal boundaries may be defined by longitudinal pole faces 110 and 120, and lateral boundaries may be defined by two series of lateral pole faces 130. In the FIG. 2 embodiment, lateral pole faces 130 are illustrated as having a straight profile, though this is not a requirement. The FIG. 2 embodiment generally defines a rectangular enclosure in the x-y plane, leaving the field unconfined in the z dimension. Based upon the dimensions of pole faces 110, 120, and 130, the extent of the generated field in the z dimension may be designated as h. In some instances, it may be desirable to consider the plane at z=h/2 to be a maximum extent (i.e., a "ceiling") of the field in the z dimension and the plane at z=−h/2 to be a minimum extent (i.e., a "floor") of the field in the z dimension. It will be appreciated, however, that the field may generally bulge beyond z=h/2 and z=−h/2 during operation. Many practical applications utilize that bulging portion at the fringes of the field. For example, when exposing an object (e.g., a device under test) located on a substrate that is too large to fit into the enclosure defined by the boundary surfaces, many testing apparatus employ the portion of the magnetic field that extends above the ceiling or below the floor. Providing a field space that is not fully enclosed also may facilitate moving objects into and out of the field space for testing or other purposes, since the absence of structural elements accommodates freedom of movement. As noted above, however, gaps in the enclosure (i.e., spaces between discrete lateral pole faces 130 and, in particular, entire planes such as z=h/2 and z=−h/2 where no pole face is provided) tend to perturb field uniformity.

Nearly perfect uniformity may be attainable using a "field cage," i.e., a field fence that fully encloses the field space. One way to accomplish this is to employ lateral boundary surfaces that have the profile of a closed loop. As illustrated in FIG. 3, one such embodiment may employ lateral pole faces 130 having a rectangular profile. It is noted that the shape a the profile for lateral pole faces 130 may be arbitrary, and is generally a matter of design choice. Various profile shapes for lateral pole faces 130 may be readily adopted to suit the use of the field space, and hence may be application specific. In some applications, it may be desirable to employ lateral pole faces 130 having circular or elliptical profiles, for instance; alternatively, profiles may be polygonal as indicated in FIG. 3.

Figure 4:
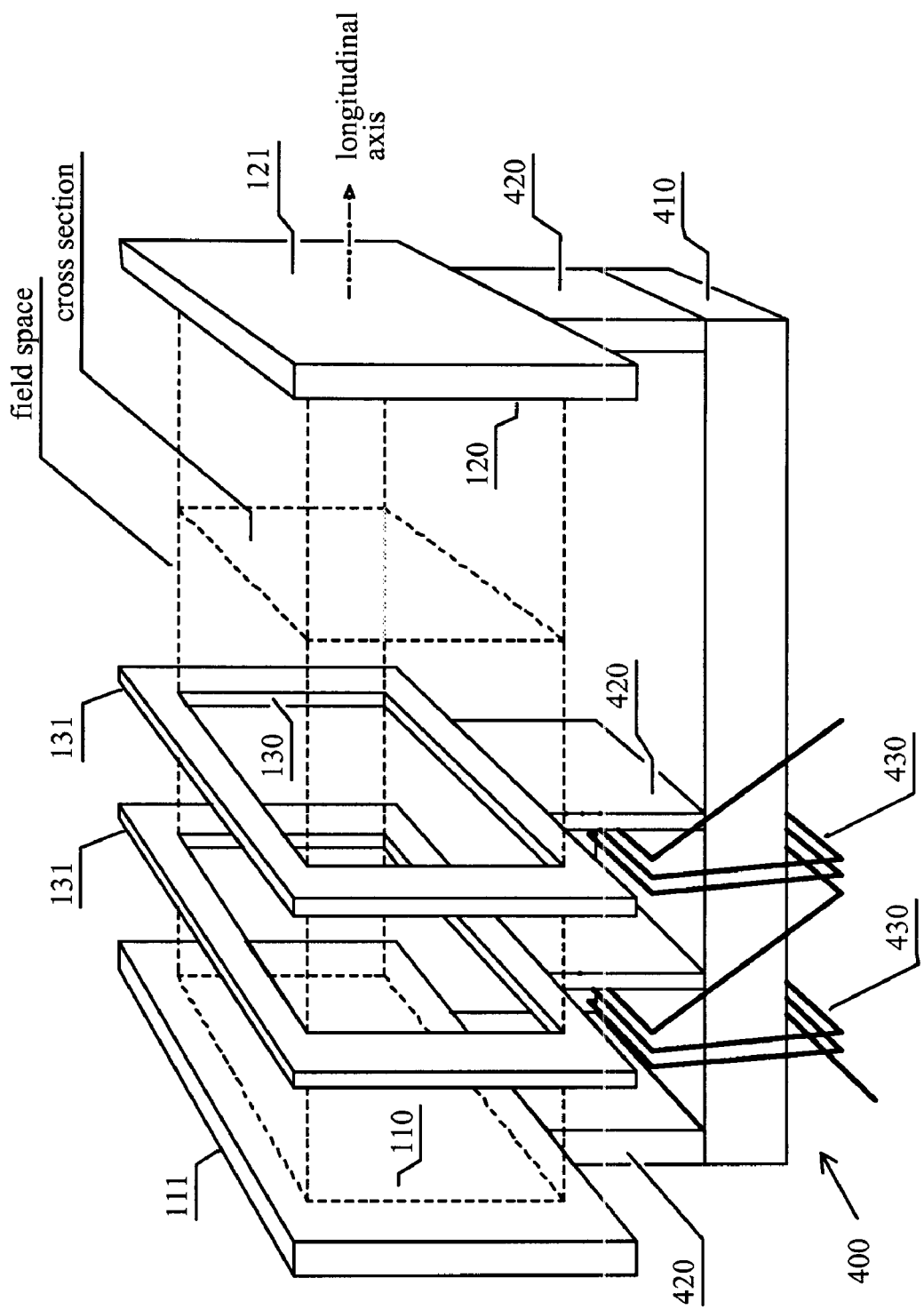
FIG. 4 is a simplified diagram illustrating components of one embodiment of an apparatus for producing a uniform magnetic field within a fully enclosed field space as depicted in FIG. 3.

FIG. 4 is a simplified diagram illustrating components of one embodiment of an apparatus for producing a uniform magnetic field within a fully enclosed field space as depicted in FIG. 3. In particular, FIG. 4 depicts one design of a drive system 400 that may facilitate supplying controlled potentials to pole faces 110, 120, and 130.

In FIGS. 3 and 4, a magnetic field is generated between longitudinal pole faces 110 and 120 of magnetic pole pieces 111 and 121, respectively. Additionally, lateral confinement may be provided by an arbitrary number, n, of lateral pole faces 130 of magnetic pole pieces 131 (only two lateral pole pieces 131 are illustrated in FIG. 4 for clarity). Those of skill in the art will appreciate that the pole faces of pole pieces are, physically, the end of a magnetic conduit; in the FIG. 4 embodiment the end of this conduit is a surface (pole faces 110, 120, and 130) that is contiguous with the boundary surface of the field space. The conduits leading to the pole faces are conventionally referred to as pole pieces (111, 121, and 131). As used herein, the term "field frame" generally refers to a pole piece 131 of a closed-loop lateral pole face 130.

It is noted that pole pieces 111, 121, and 131 are disposed outside of the field space, with their respective pole faces 110, 120, and 130 generally defining the boundary surfaces of the field space. A plurality of lateral pole pieces 131 are disposed at respective lateral boundary planes spaced along the longitudinal axis intermediate longitudinal pole pieces 111 and 121. The profiles of lateral pole faces 130 generally define a lateral boundary surface parallel to the longitudinal axis.

As illustrated in FIG. 4, drive system 400 generally comprises a magnetic yoke 410, a plurality of yoke extensions 420 coupling pole pieces 111, 121, and 131 to yoke 410, and a plurality of drive coils 430 comprising coil windings wound around yoke 410 between adjacent extensions 420. Yoke 410, extensions 420, and pole pieces 111, 121, and 131 represent magnetic conduits operative to supply controlled magnetostatic potentials to pole faces 110, 120, and 130. In particular, yoke 410 may provide (in cooperation with extensions 420) a low reluctance magnetic connection between pole pieces 111, 121, and 131. Factors influencing the magnitude of a respective magnetostatic potential to a respective pole face 110, 120, or 130 include, but are not limited to, the number of windings in drive coils 430 and the instantaneous or average current passing through drive coils; further, magnetostatic potentials may be affected by the material employed to construct the various components, or by a combination of the foregoing and other factors.

In the structural arrangement depicted in FIG. 4, one longitudinal pole piece 111 is magnetically coupled (via an extension 420) to one end of yoke 410, while another longitudinal pole piece 121 is magnetically coupled (also via an extension 420) to the other end of yoke 410; lateral pole pieces 131 are magnetically couple to yoke 410 intermediate the ends via a respective extension 420. In an embodiment, yoke 410, extensions 420, and pole pieces 111, 121, and 131 are constructed of or comprise a soft magnetic material and are dimensioned in accordance with a magnetic permeability value and a saturation magnetization value associated with the soft magnetic material. This structural arrangement may facilitate providing a low reluctance magnetic connection between the elements.

In operation, drive system 400 provides a plurality of magnetomotive force generators comprising drive coils 430, each of which is coupled to yoke 410 and disposed between longitudinally adjacent pole pieces 111, 112, and 113. In that regard, the FIG. 4 embodiment employs a drive coil 430 wound around yoke 410 between each pair of adjacent extensions 420. Each drive coil 430 is a coil winding of current carrying conductor wound around yoke 410. The length of extensions 420, as well as the distance between them (i.e., along the longitudinal axis), may determine or influence the available winding space for each drive coil 430. A drive current passing through each drive coil 430 produces a magnetomotive force [F] that equals the difference in potential between longitudinally adjacent extensions 420. As illustrated in FIG. 4, drive coils 430 may be electrically connected in series, although this is not necessary, and may not be desirable in certain applications.

Figure 5:
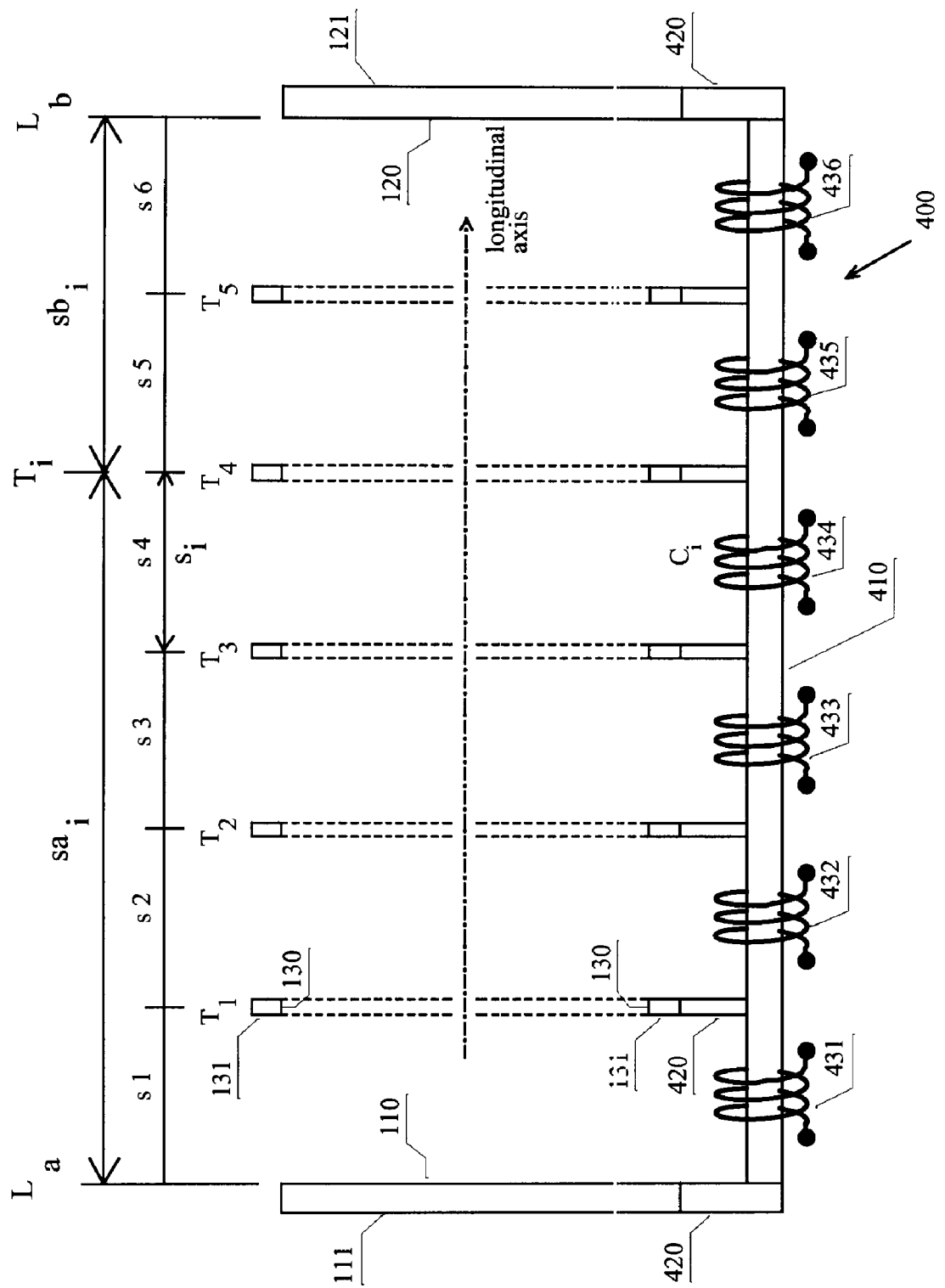
FIG. 5 is a simplified schematic representation illustrating one example of a design protocol for a confined field uni-axial magnet employing a single yoke drive system.

FIG. 5 is a simplified schematic representation illustrating one example of a design protocol for a confined field uni-axial magnet employing a single yoke. It is noted that FIG. 5 is a longitudinal cross section of the apparatus illustrated in FIG. 4. As described above with reference to FIG. 4, drive system 400 generally comprises yoke 410 carrying drive coils 431-

436 disposed between yoke extensions 420. The field space is defined by longitudinal pole faces 110 and 120 (labeled $L_a$ and $L_b$ in FIG. 5), and lateral (or transverse) pole faces 130 (labeled $T_1, T_2 \ldots T_5$ in FIG. 5). The respective potentials on longitudinal pole faces 110 and 120 will be denoted $P(L_a)$ and $P(L_b)$, whereas on lateral pole faces 130, the respective potentials will be denoted $P(T_1) \ldots P(T_5)$. The longitudinal distance between each pair of longitudinally adjacent pole faces is given as s1, s2 . . . s6. With the foregoing conventions, the $i^{th}$ field frame, $T_i$, has a potential $P(T_i)$ and is separated from $L_a$ by a distance $sa_i$ and from $L_b$ by a distance $sb_i$. The potential within a uniform field increases linearly along the field direction and hence, the potential supplied to the field frame $T_i$, according to protocol, is proportional to its position between $L_a$ and $L_b$. Therefore, $P(T_i)$ may be expressed as follows $$P(T_i) = \frac{P(L_a) \times sa_i + P(L_b) \times sb_i}{s} \quad \text{[Equation 1]}$$

where s represents the total distance between longitudinal pole faces 110 and 120. Specifically, magnetomotive force generators may be employed to provide respective magnetostatic potentials to respective poles faces (110, 120, and 130) of longitudinally adjacent pole pieces (111, 121, and 131) in accordance with positions of the pole faces (110, 120, and 130) along the longitudinal axis.

An electric activation or drive current, $I_i$, through a coil, $C_i$, produces a magnetomotive force [F] having a magnitude given by a product of the amplitude of the drive current and the number of turns in the winding, $N_i$, as follows:

$$F(C_i) = I_i \times N_i \quad \text{[Equation 2]}$$

The value of this magnetomotive force equals the potential difference between adjacent yoke extensions 420, and (in accordance with Equation 1) is equal to $$F_i = P(T_i) - P(T_{i-1}) = \frac{s_i}{s}[P(L_a) - P(L_b)] \quad \text{[Equation 3]}$$

The chain of magnetic forces generated by coils 431-436 produces, at successive pole faces, a progression of potentials, each of which has a value that is a discrete approximation to the linearly varying potential of an unconfined uniform field. As noted above, in some embodiments, magnetomotive force generators comprising drive coils 430 may be configured and operative to produce a magnetomotive force having a value that is proportional to a distance between respective longitudinally adjacent pole faces.

It will be appreciated that a uni-axial confined field magnet comprising (n–2) field frames (i.e., lateral pole pieces 131) generally requires (n–1) drive coils 430 to produce (n) P values for (n) pole faces (both longitudinal and lateral). The difference in potential between longitudinal pole faces 110 and 120 equals the sum of the magnetic forces produced by drive coils 430. This is the same as with a conventional magnet. Therefore, the confined field magnet apparatus illustrated in FIGS. 4 and 5 has no additional coil windings as compared to traditional approaches; the embodiments simply employs a segmented coil instead of the single one.

Figure 6:
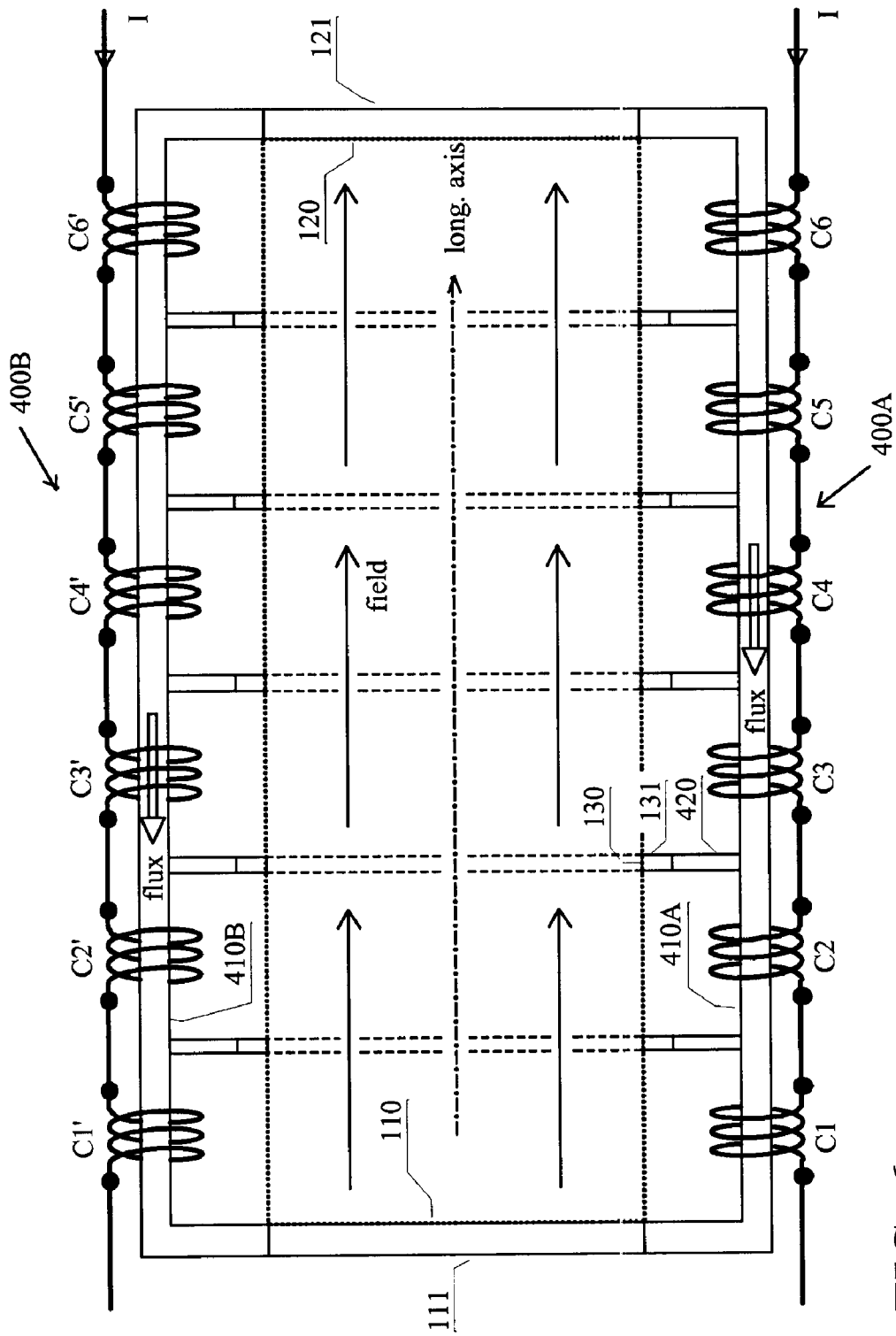
FIG. 6 is a simplified schematic representation illustrating one example of a design protocol for a confined field uni-axial magnet employing parallel drive systems.

FIG. 6 is a simplified schematic representation illustrating one example of a design protocol for a confined field uni-axial magnet employing parallel drive systems. The schematic shown in FIG. 6 represents one design variation as compared to that described above with reference to FIG. 5. Each drive system 400A and 400B generally operates substantially as described above. However, the arrangement in FIG. 6 tends to improve the uniformity of potential over pole faces 101, 120, and 130. Dual drive embodiments may arrange drive systems 400A and 400B symmetrically about the longitudinal axis. In some implementations, all pole faces 110, 120, and 130 may be spaced equally (i.e., the longitudinal distance between adjacent pole faces, whether longitudinal or lateral, is constant) such that the magnetostatic potential increases in equal increments; if identical coil windings are used, they may be connected serially as depicted in FIG. 6. Such a dual drive embodiment of a uni-axial magnet may be employed to provide one field component of a bi-axial magnet as set forth in detail below.

As another design choice, a drive system such as illustrated in FIGS. 5 and 6 may further comprise a drive circuit (such as a microcontroller, a programmable logic controller (PLC), or an application specific integrated circuit (ASIC), for example). Such drive logic or circuitry may be employed to control the activation current provided to the drive coils associated with a plurality of magnetomotive force generators; in some implementations, such control may be dictated or influenced as a function of the respective dimensions and magnetic permeability values or other characteristics of each of the pole pieces.

Confining a Bi-Axial Field

Bi-axial magnets, which enable control of field magnitude and direction, generally may be implemented using two orthogonally aligned uni-axial magnets configured to generate two independently controllable field-components, Hx and Hy. The resulting field, $\vec{H} = Hx\hat{x} + Hy\hat{y}$, is the vectorial addition of these field components, where x and y are respective longitudinal axes of each independent uni-axial system.

As illustrated in FIG. 1B, field uniformity in conventional bi-axial systems is poor. In most bi-axial implementations, uniformity is degraded not only by the spreading of the field, but even more significantly, by the field from one system being shunted by the pole pieces of the other system. Only a very small central region with desirable field uniformity characteristics typically remains. A simple conceptual solution to both of these deleterious effects on uniformity involves confining the field from each uni-axial system Hx and Hy) onto a confined path, and thereby obtaining a perfectly uniform field within a region of intersection.

Figure 7:
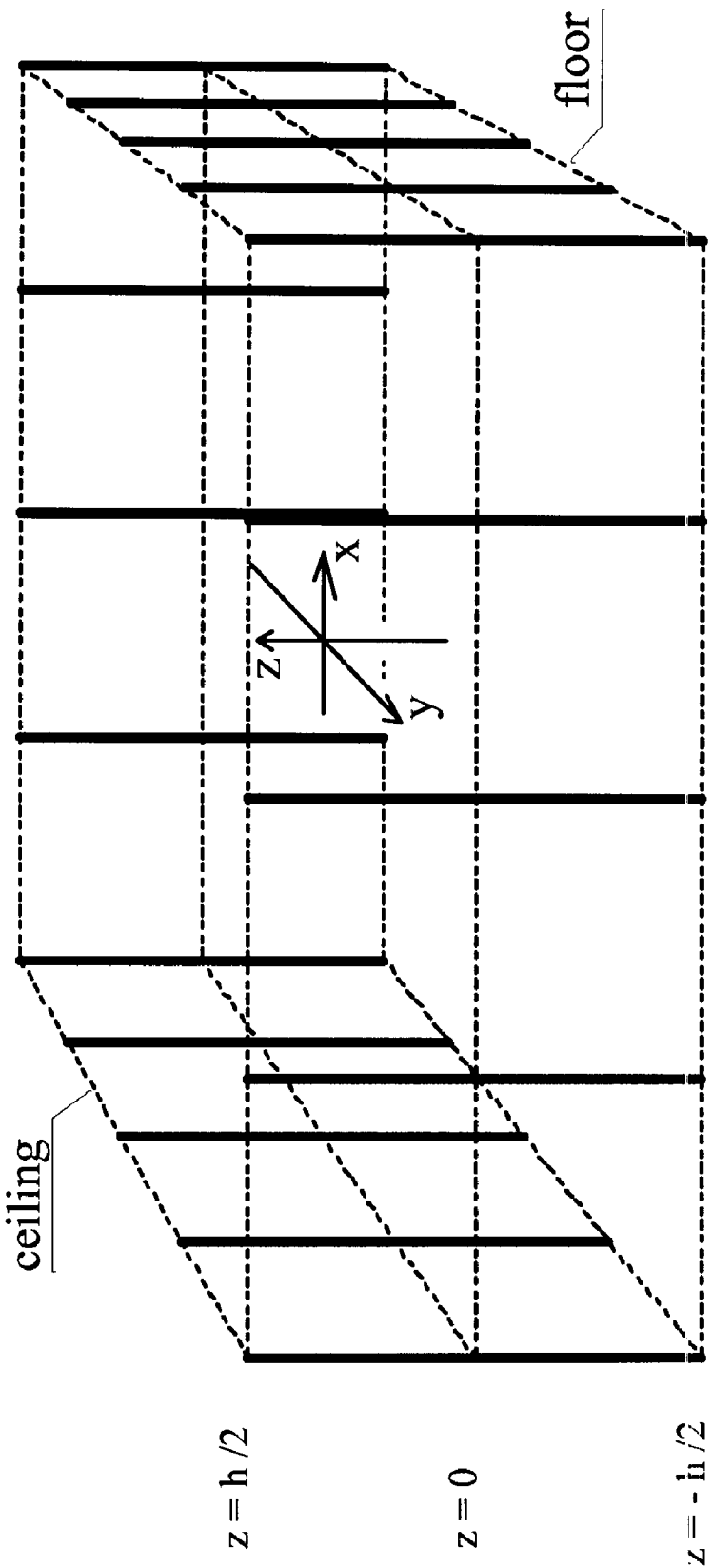
FIG. 7 is a simplified diagram illustrating a collection of pole faces aligned with a rectangular field space of a bi-axial magnet system.
Figure 8:
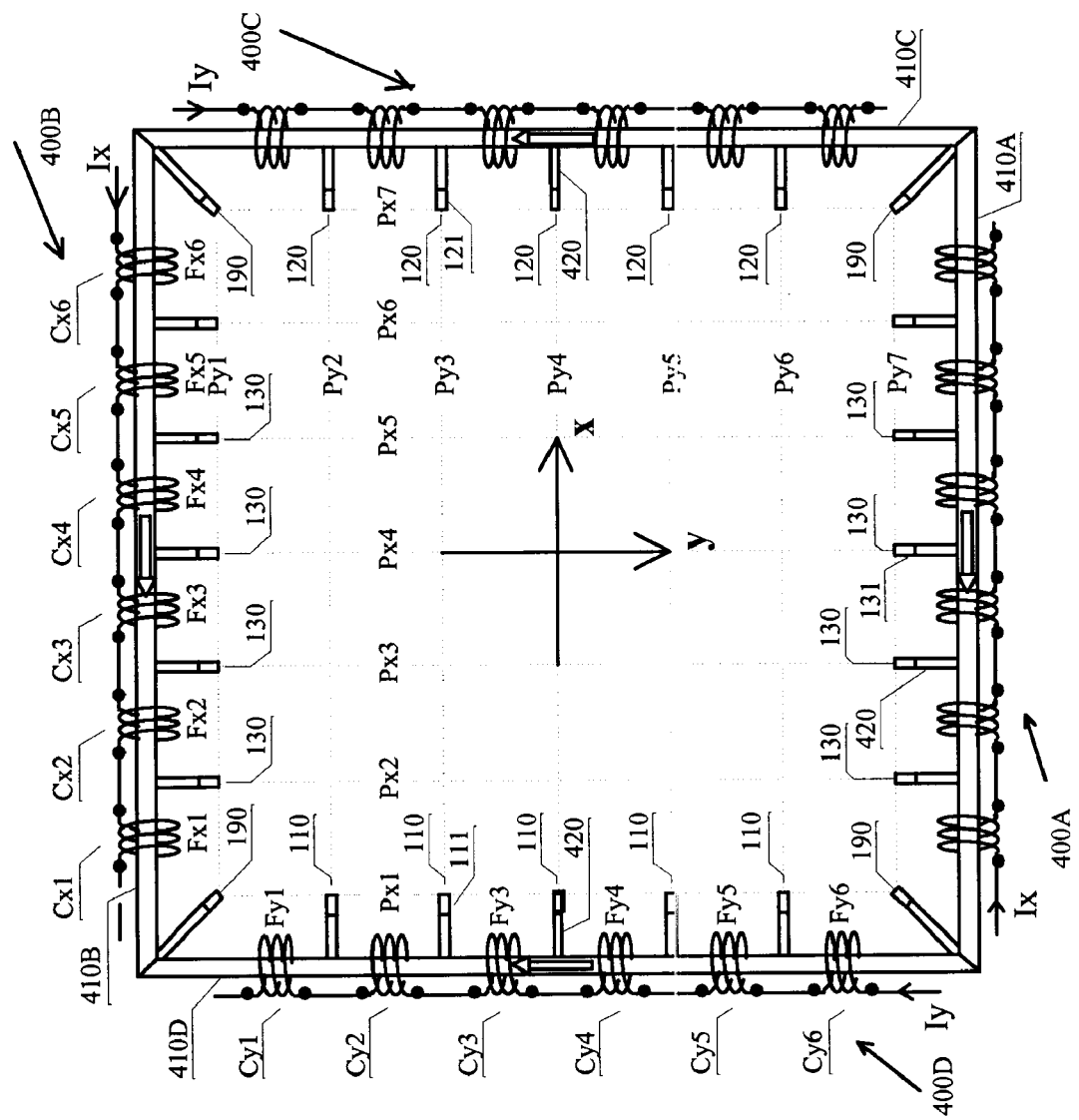
FIG. 8 is a simplified schematic representation illustrating one example of a design protocol for a confined field bi-axial magnet.

Specifically, if two uni-axial systems generate orthogonal field components, each being confined to a constant width relative to its longitudinal axis (i.e., a "field lane"), then orthogonal intersection of the field lanes may be the perfect bi-axial field space. In an arrangement employing two uni-axial systems such as illustrated in FIG. 2, in which each uni-axial field lane is defined by a pair of field fences (i.e., lateral pole faces) along the system's longitudinal axis, then the orthogonal intersection of these lanes generally defines a rectangular bi-axial field space enclosed by four fence segments as is depicted in FIG. 7. Extending from that field space, each respective lane is terminated by the respective system's longitudinal pole faces. While an orthogonal implementation of two such uni-axial systems may provide a uniform field that is controllable in magnitude and direction over a bi-axial field space, the arrangement has a major shortcoming, namely, the bi-axial field space is substantially smaller than the region bounded by the longitudinal pole faces. This limitation may be circumvented realizing that the solid longitudinal pole faces in a uni-axial system may be replaced by an array of discrete longitudinal pole faces (each at the same magnetostatic potential) without affecting system function. The foregoing structural modification enables the bi-axial field space illustrated in FIG. 7 to be coincident with the total field space of both uni-axial systems, i.e., each of the four enclosing boundary surfaces serves simultaneously as a lateral boundary for one uni-axial system and as a longitudinal boundary for the other uni-axial system. This arrangement facilitates efficiently confining the bi-axial field space. In some bi-axial embodiments, a drive system may supply each pole face with a magnetoststic potential having a value that is generally in accord with the uni-axial design protocol set forth above. Efficient driving may be achieved by orthogonally superposing two of the uni-axial drive systems illustrated in FIG. 6 as set forth in more detail below. One embodiment of drive system construction is shown in FIG. 8. As illustrated in FIG. 8, orthogonal superposing of two uni-axial systems has been made possible by segmenting the (formerly solid) longitudinal pole faces into a plurality of (magnetically parallel) separate pole faces to allow for the insertion of drive coils between associated yoke extensions.

In that regard, FIG. 7 is a simplified diagram illustrating a collection of pole faces aligned with a rectangular field space of a bi-axial magnet system, and FIG. 8 is a simplified schematic representation illustrating one example of a design protocol for a confined field bi-axial magnet. Comparing FIGS. 6 and 8, it is apparent that solid longitudinal pole faces 110 and 120 in FIG. 6 have been segmented into a respective plurality of pole faces 110 and 120 in FIG. 8. In some implementations, pole faces 190 may be added to the corners where yokes 410A-410D intersect, although in other embodiments, pole faces 190 may be omitted to simplify construction. In the illustrated embodiment, the parallel drive systems 400A and 400B may be deployed to control the magnetostatic potentials generating and confining the field component Hx, while the drive systems 400C and 400D may be deployed to control the magnetostatic potentials generating and confining the field component Hy.

In operation, the components of the system illustrated in FIG. 8 may function substantially as set forth above with reference to FIGS. 2-6, except that two orthogonal field components (i.e., Hx and Hy) are generated independently. It will be appreciated that, with respect to the Hx component, pole faces 110 and 120 are longitudinal pole faces and pole faces 130 are lateral or transverse pole faces, whereas with respect to the Hy component, the opposite is true (i.e., pole faces 130 are longitudinal pole faces and pole faces 110 and 120 are lateral pole faces). It is noted that pole faces 190 may provide both lateral and longitudinal confinement, depending upon which of the component fields is considered.

The replacement of solid longitudinal pole faces with a plurality of discrete longitudinal pole faces does not affect the function of a uni-axial field system (except for introducing a minor perturbation of field uniformity near those pole faces). Activating the Hx drive systems 400A and 400B in parallel produces magnetostatic potentials Px1 to Px7 for generating and confining the Hx field. In this case, the longitudinal pole faces 110, connected through the magnetic conduit 410D, are all at the potential Px1 while the longitudinal pole faces 120, connected through the magnetic conduit 410C, are all at the potential Px7. In accord with the uni-axial design protocol described above, consecutively increasing potentials may be supplied to the pole faces 130 (lateral pole faces for confining the Hx field component). Similarly, activating the Hy drive systems 400C and 400D in parallel produces magnetostatic potentials Py1 to Py7 for generating and confining the Hy field. In this case, the pole faces 130 (longitudinal pole faces when considering the Hy field component), connected through the magnetic conduit 410B, are all at the potential Py1 while the pole faces 130, connected through the magnetic conduit 410A, are all at the potential Py7. Consecutively increasing potentials may be supplied to the pole faces 110 and 120 for confining the Hy field component. When both, the Hx and the Hy drive systems are activated, then the magnetostatic potential supplied to each pole piece has a value equal to the sum of values supplied by each drive system for generating the given magnitudes of the Hx and Hy field components.

As noted above, the bi-axial assembly of FIG. 8 produces a field that is a vectorial addition of two orthogonal field components, Hx and Hy, each of which is produced by a respective uni-axial system. The drive systems 400A-400D work in combination on a rectangular yoke, represented by yokes 410A-410D. The collection of all pole faces defines a rectangular enclosure where there exists a laterally confined Hx field and a laterally confined Hy field. The combined field, $\vec{H}=Hx\hat{x}+Hy\hat{y}$, is the vectorial addition of these field components, where x and y are respective longitudinal axes of each independent uni-axial system. The magnitude and direction of the combined field may be controlled by controlling the magnitude of Hx and Hy individually.

In this example, the enclosure of this region generally comprises a pair of field fences parallel to the x axis (i.e., pole faces 130 and 190) and a pair of field fences parallel to the y axis (i.e., pole faces 110, 120, and 190). In the FIG. 8 embodiment, seven pole faces are employed for each "fence," with pole faces 190 being common to adjacent fences. It is noted that the number of pole faces is an arbitrary design choice, and that more or fewer may be employed in accordance with overall system requirements, manufacturing considerations, cost constraints, or a combination of these and other factors.

As set forth above, each pole piece (111, 121, 131, and 191) may be connected to a yoke (410A-410D) via a yoke extension 420, providing a low reluctance magnetic connection to supply pole faces 110, 120, 130, and 190 with a desired magnetostatic potential. Given the structural arrangement of FIG. 8, six drive coils (Cx1-Cx6 and Cy1-Cy6) on each yoke 410A-410D may be operative to generate respective magnetomotive forces (e.g., Fx1, Fx2, ... Fx6 along the x axis, and Fy1, Fy2. Fy6 along the y-axis) as desired. In that regard, drive currents Ix and Iy may be employed to produce potentials labeled Px1, Px2. Px7 along the x axis, and Py1, Py2. Py7 along the y axis. FIG. 8 depicts a regular rectilinear and orthogonal pattern of equipotential lines connecting corresponding pole faces on opposite sides of the respective longitudinal axes. This suggests perfect uniformity of each field component, Hx and Hy, and hence of the combined bi-axial field. Ignoring perturbations along the boundaries as discussed above, perfect uniformity would indeed exist if the field space extended without limit along the z-axis. Given that the spatial extent of the bi-axial field space is limited, as set forth in more detail below, a distortion of field uniformity possibly exists near or beyond the geometrical floor or ceiling of the field space.

The functional independence of the two field components, Hx and Hy, means that the operation of a bi-axial system may be fully described by considering the generation of each field component individually, i.e., the longitudinal boundary of one system serves and as the lateral boundary of the other system, and vice-versa. The uni-axial design protocol set forth above with reference to FIGS. 3-5 fully applies. The superposition is effected by adding, at each pole face (110, 120, 130, and 190) the values of magnetostatic potential prescribed by each of the two independent uni-axial systems.

By way of an illustration: with respect to Hx, pole faces 110,190 along the left of FIG. 8 (i.e., the left "y-fence") are at the same potential (Px1), and pole faces 120,190 along the right y-fence are at the same potential (Px7). Pole faces 130 along both x-fences carry a respective potential (Px2 ... Px6) determined as a function of location along the x axis. In the foregoing manner, the proper boundary condition for a confined uni-axial field is established for Hx. The analog is true with respect to Hy: pole faces 130,190 along the top x-fence are at the same potential (Py1), while pole faces 130,190 along the bottom x-fence are at the same potential (Py7). Pole faces 110 and 120 along the y-fences carry a respective potential (Py2 ... Py6) determined as a function of location along the y axis. With all drive systems 400A-400D activated, the potential at each pole face 110,120,130, and 190 may be equal to the sum of values generated by each uni-axial system individually.

In accordance with one embodiment (such as illustrated in FIGS. 7 and 8), a bi-axial magnet may employ a square region of confinement provided by field fences having pole faces at equal spacing. The magnetomotive forces to be generated are hence all equal, and each drive system may employ identical coils; each coil in a respective drive system may be connected in series and activated with the same drive current. Other configurations are also possible, as will be understood by those of skill in the art, and the present disclosure is not intended to be limited by any particular shape, geometric arrangement, or density of pole faces defining the boundary surfaces of the field space.

The embodiment illustrated as a simplified diagram in FIG. 8 encloses a bi-axial field space in the x-y plane, but the field may generally be unconfined along the z-axis. Generally, it is not topologically possible to fully enclose a bi-axial field space; this is exemplified in the problem associated with attempting to superpose two uni-axial systems having their field space fully enclosed laterally by field frames (such as illustrated in FIG. 4). Problems arise because the magnetostatic potential supplied to pole pieces around the field space is shorted by their segments crossing over the field space. Such shorting is prevented only if those pieces are magnetically unconnected. The required gap implies that there exists some opening in the enclosure. As will be discussed below, the shape of this opening may be tailored to the needs of the system's application. The enclosure depicted schematically in FIG. 7 exemplifies a simple enclosure geometry providing partial confinement of a bi-axial field space. In this example, a rectangular enclosure employs a field fence with sixteen total pole faces: five along each side, including four shared corner pole faces. In this example, each pole face has a uniform height, h. As noted above, a geometrical ceiling may be defined at z=h/2, and a floor may be defined at z=−h/2; these dimensions assume a central plane at z=0. Also as noted above, the floor and ceiling designations are merely geometrical as the generated magnetic field will tend to bulge through these planes.

The field space may be confined more fully, for example, by bending or curving the ends of the pole faces inward (i.e., towards each other, generating a concave profile), and thereby improve field uniformity inside the enclosure. Conversely, for applications utilizing the bulging portion of the field beyond z=h/2 or z=−h/2, it may be desirable in some instances to broaden that region, for example, by curving the ends of the pole faces outward (i.e., away from each other, generating a convex profile).

In that regard, FIGS. 9A-9C are simplified diagrams illustrating various embodiments of pole face profiles, and FIGS. 10A-10C are simplified diagrams illustrating an arrangement of pole faces in one embodiment of a bi-axial magnet employing pole faces having convex profiles. Some representative profiles worth considering for various applications are straight (FIG. 9A), concave (FIG. 9B), and convex (FIG. 9C). FIG. 9 also indicates a resulting field configuration associated with each respective profile shape. The field configurations may be deduced by knowing that along a given pole face, the field vector is locally perpendicular to the profile. Implementation of non-straight profiles, however, creates challenges that do not arise with a uni-axial system in which the profile defines the shape of the lateral boundary surface only. In contrast, each pole face in a bi-axial system is used concurrently as a longitudinal boundary component by one system and as a lateral boundary component by the other system.

Consider the pole faces intersecting a plane oriented normal to the z-axis. When the pole face profiles are not straight (FIG. 9A) but concave (FIG. 9B) or convex (FIG. 9C) then the pattern of intersection points changes with elevation, i.e., the position of the plane along the z-axis. The pattern of intersection points should be changing congruently with changes in elevation in order to retain the orthogonal and rectilinear pattern of equipotentials in concert with the design protocol described above. This is illustrated in FIGS. 10A and 10B, which show, respectively, intersection points of pole faces having convex profiles for a plane at a first elevation [z1] and a plane at a second elevation [z2]. The lines connecting corresponding pole faces at opposite field fences are the presumed lines of equipotential, although it is understood that the depicted rectilinear pattern is an approximation. Comparing FIGS. 10A and 10B, it is readily apparent that the points of intersection have all shifted radially going from [z1] to [z2]. FIG. 10C depicts, at progressively lower elevations, the track of intersection points if congruency is to be retained over that range of elevation. As demonstrated by the plots in FIG. 10C, it may be desirable in some instances that each profile lie in an azimuthal plane. It is noted that, when moving from [z1] to [z2], the point located in the diagonal azimuth, $r_d$, has shifted a larger distance than the point located in a orthogonal azimuth, $r_o$. Accordingly, the profile for each pole face may be scaled in accordance with azimuth. In accordance with some embodiments employing a curved pole face profile, it may be desirable that the profiles of the pole faces are shaped and oriented such that the profiles' positions change congruently as a function of elevation.

Ideally, it may be desirable that all conduits (e.g., yoke 410, extensions 420, and pole pieces 111, 121, 131, and 191) transmit magnetostatic potentials without loss along the conduit. Those characteristic are generally ascribed to a class of magnetic materials referred to as "soft magnetic" materials, i.e., generally characterized by a large value of permeability and a lack of hysteresis. Some implementations may benefit from linearity of response; accordingly, it may be desirable to minimize or eliminate saturation effects. It will be appreciated that some applications, therefore, may require that the various conduits have sufficient cross-section for a given material with a given value of saturation magnetization. The foregoing and other design criteria and material selection techniques are generally known to those of skill in the art.

Generally, there are two well-established methods of controlling the field output of a magnet: by directly controlling the drive or activation current based upon (for example) an initial calibration of the system; or, using a closed loop approach, by selectively adjusting the drive current based upon measured values of attained field strength. Direct control of field strength is generally viable only when system response is sufficiently linear. Closed loop control generally offers better accuracy and more relaxed linearity requirements, but necessitates the implementation of field sensors. Either of the foregoing methodologies may be employed in the context of the present disclosure. The drive systems illustrated in the drawing figures and described above may include appropriate control circuitry or logic to facilitate the functionality described herein. In that regard, as noted above with reference to a uni-axial design, it may be desirable in bi-axial embodiments to provide a drive system comprising a drive circuit or logic (such as may be embodied in a microcontroller, a PLC, or an ASIC). Such drive logic or circuitry may be employed to control the activation current provided to the drive coils associated with a plurality of magnetomotive force generators.

Figure 11:
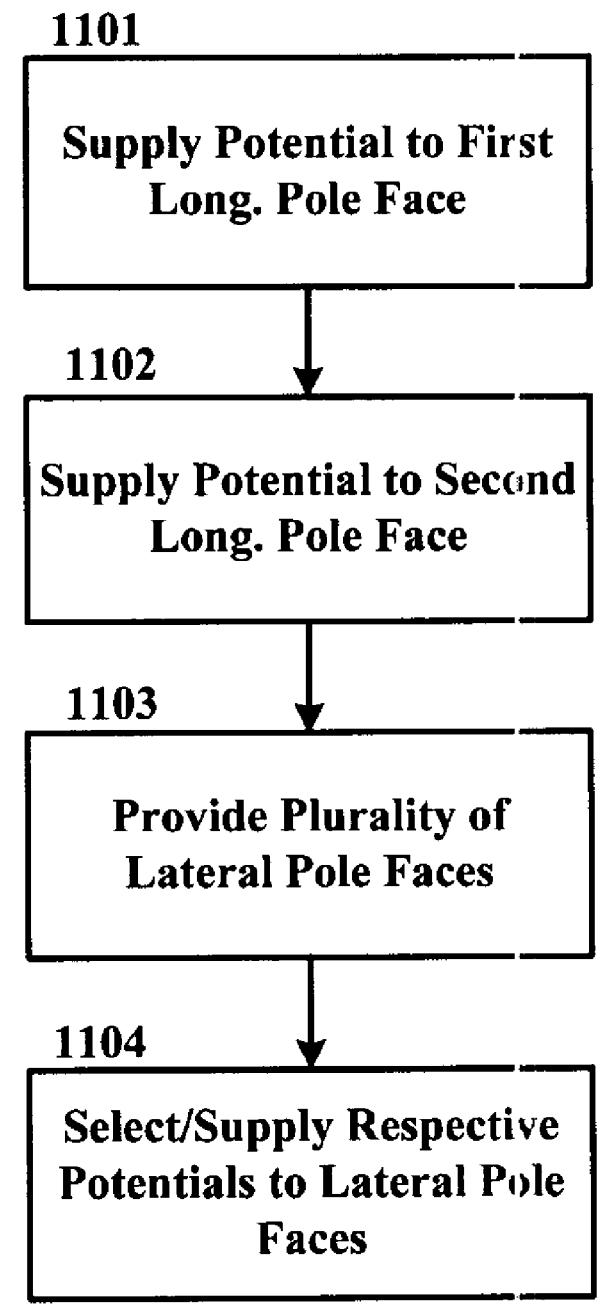
FIG. 11 is a simplified flow diagram illustrating general operation of one embodiment of a method of producing a substantially uniform magnetic field having a controllable magnitude.

FIG. 11 is a simplified flow diagram illustrating general operation of one embodiment of a method of producing a substantially uniform magnetic field having a controllable magnitude. A magnetostatic potential may be supplied to a first longitudinal pole face at a first longitudinal boundary oriented substantially normal to a longitudinal axis as indicated at block 1101. A magnetostatic potential may be supplied to a second longitudinal pole face at a second longitudinal boundary oriented substantially normal to the longitudinal axis as indicated at block 1102. A plurality of lateral pole faces may be provided as indicated at block 1103. As set forth above, the lateral pole faces may generally be disposed along a lateral boundary surface intermediate the first and second longitudinal boundaries, and each lateral pole face may be disposed in a respective lateral boundary plane oriented substantially normal to the longitudinal axis.

As described in detail above, a respective magnetostatic potential may be supplied to each respective one of the lateral pole faces as indicated at block 1104. The value of the respective magnetostatic potential may be selected in accordance with a position of the respective lateral boundary plane relative to the first and second longitudinal boundaries.

Figure 12:
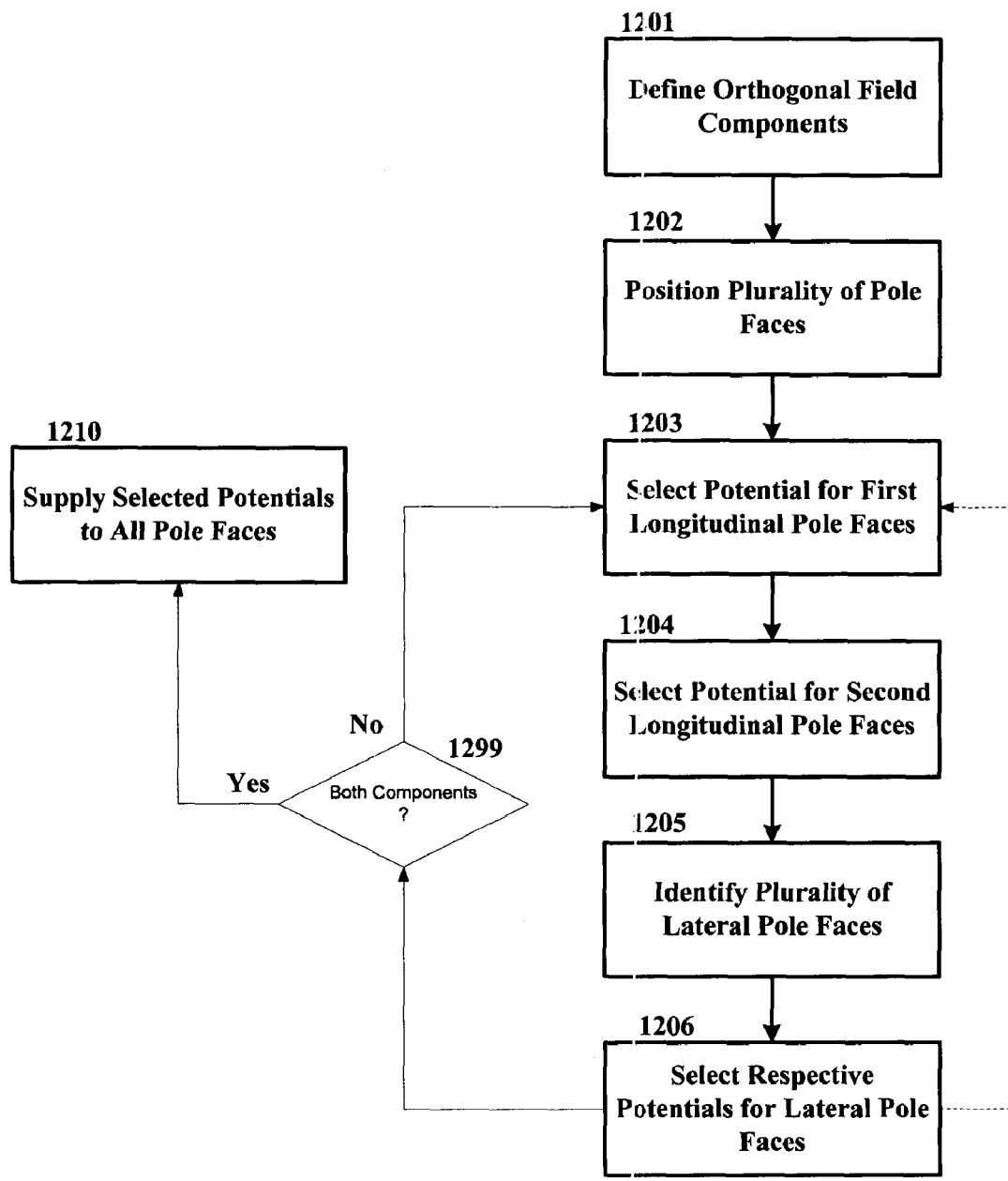
FIG. 12 is a simplified flow diagram illustrating general operation of one embodiment of a method of producing a substantially uniform magnetic field having a controllable magnitude and direction.

FIG. 12 is a simplified flow diagram illustrating general operation of one embodiment of a method of producing a substantially uniform magnetic field having a controllable magnitude and direction. In some embodiments, such a method may begin by defining two orthogonal field components (block 1201): a first field component to be generated along a first longitudinal axis; and a second field component to be generated along a second longitudinal axis. A plurality of pole faces may be positioned at locations along each of the first and second longitudinal axes as indicated at block 1202.

Next, a first magnetostatic potential to apply to a first plurality of longitudinal pole faces at a first longitudinal boundary may be selected (as indicated at block 1203), while a second magnetostatic potential to apply to a second plurality of longitudinal pole faces at a second longitudinal boundary may be selected (as indicated at block 1204). A plurality of lateral pole faces may be identified as indicated at block 1205. As set forth above, these lateral pole faces may be disposed along a lateral boundary surface intermediate the first and second longitudinal boundaries, and each may be disposed in a respective lateral boundary plane oriented substantially normal to the longitudinal axis. For each respective one of the plurality of lateral pole faces, a value of a respective magnetostatic potential may be selected in accordance with a position of the respective lateral boundary plane relative to the first and second longitudinal boundaries (block 1206).

It is noted that the operations depicted at blocks 1203 through 1206 may be repeated for each of the orthogonal field components, as indicated by the loop back to decision block 1299. If a determination is made that both field components have not been selected, the process may continue, iterating the operations at blocks 1203-1206 for the second field component. If, on the other hand, a determination is made that both field components have been selected, the magnetic field may be generated by vectorial addition of the field components. In particular, selected values of magnetostatic potential may be supplied to all pole faces as indicated at block 1210. As noted above, the respective potential to be supplied to each respective pole face may be an addition of the potentials determined for that pole face in each of the uni-axial systems. In the foregoing manner, a substantially uniform magnetic field that is controllable in magnitude and direction within the field space may be generated.

It is noted that the embodiment depicted in FIG. 12 may have particular utility when used in conjunction with a closed loop management or control system. Where one or more field sensors (e.g., at least one field sensor for each field component) or other detection mechanisms are employed to monitor the strength of the generated field, feedback may be employed dynamically (e.g., by drive circuitry or logic as set forth above) to alter or otherwise to adjust the magnetostatic potentials selected for various of the pole faces in the system. This closed loop feedback is represented in FIG. 12 by the dashed arrow from block 1206 back to block 1203.

Figure 13:
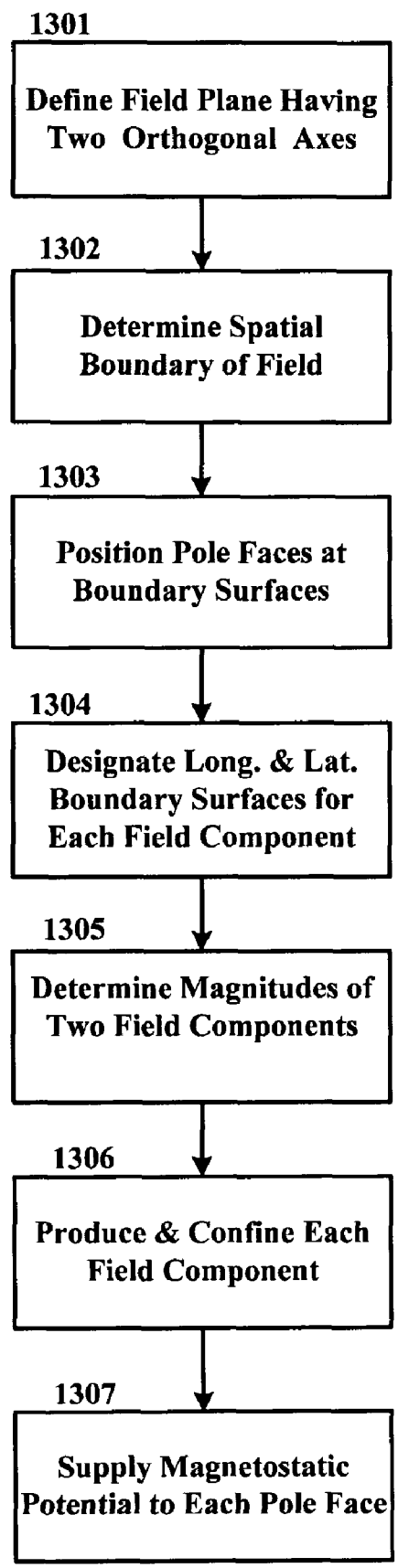
FIG. 13 is a simplified flow diagram illustrating general operation of another embodiment of a method of producing a substantially uniform magnetic field having a controllable magnitude and direction.

FIG. 13 is a simplified flow diagram illustrating general operation of another embodiment of a method of producing a substantially uniform magnetic field having a controllable magnitude and direction. In some implementations, such a method may begin by defining a field plane having two orthogonal axes (block 1301), each generally defining a longitudinal axis for a respective field component.

The spatial boundary of the field to be generated may be defined as indicated at block 1302; in some implementations, the boundary may be designated or determined by identifying a rectangular region in the field plane bounded by boundary surfaces intersecting the field plane perpendicular to each longitudinal axis. These boundary surfaces, or enclosing surfaces, serve to enclose the field within a particular space; as noted above, it is not possible fully to enclose a bi-axial field space, but the field space may readily be enclosed in the field plane defined by the orthogonal longitudinal axes. In that regard, a spatial boundary in the field plane may generally comprise a respective pair of boundary surfaces aligned parallel to, and positioned on opposite sides of, each respective longitudinal axis. A plurality of pole faces may be positioned at each of the boundary surfaces (block 1303) to facilitate definition of the spatial boundaries of the field space.

"Longitudinal" and "lateral" boundary surfaces and pole faces may be designated for each field component (block 1304). As set forth above, a longitudinal boundary surface for one field component (e.g., Hx) may be a lateral boundary surface for the other field component (e.g., Hy) and vice-versa. For each of the respective first and second field components, the pole faces at the boundary surfaces that are perpendicular to the respective longitudinal axis may be designated as longitudinal pole faces, and the pole faces at the boundary surfaces that are parallel to the respective longitudinal axis may be designated as lateral pole faces. For example, for the first field component, a method may designate as "longitudinal" the two boundary surfaces (and the pole faces at those boundary surfaces) oriented perpendicular to a particular longitudinal axis, and may then designate as "lateral" the two boundary surfaces (and the pole faces at those boundary surfaces) oriented parallel to that particular longitudinal axis; the inverse would be true for the second field component.

The magnitude of each respective field component may be determined as indicated at block 1305. As set forth above, these magnitudes may be selected or otherwise determined such that a vectorial addition of the two field components yields a desired magnitude and direction of the magnetic field to be produced. Each field component may be produced and confined as indicated at block 1306. With respect to production, a method may produce each respective field component by selecting a first value of magnetostatic potential to all the pole faces disposed along its first longitudinal boundary surface and selecting a second value of magnetostatic potential to all the pole faces disposed along its second longitudinal boundary surface. As noted above, the difference between these magnetostatic potentials may be proportional to the determined or desired magnitude of the respective field component. With respect to confinement, a method may confine each respective field component by selecting, for each pole face disposed along a lateral boundary, a magnetostatic potential having a value intermediate the values supplied to the pole faces at the longitudinal boundaries. As noted above, a respective value for a lateral pole face may be proportional to the distances of separation between that lateral pole face and each longitudinal boundary.

Further, selecting or otherwise determining values of magnetostatic potentials to be supplied to the pole faces may generally comprise selecting magnetostatic potentials that are proportional to the selected magnitudes of each of the first and second field components. As noted above, a magnetic field to be generated is the vectorial combination of each field component. Accordingly, a method may supply, to each pole face, a magnetostatic potential having a value equal to the sum of values associated with producing and confining each of the two field components. This is indicated at block 1307. In some embodiments, the operation depicted at block 1307 may supply magnetostatic potentials to the collection of pole faces using a shared magnetic conduit that is an orthogonal superposition of respective uni-axial drive systems.

It is noted that the arrangement of the blocks in FIG. 13 does not necessarily imply a particular order or sequence of events, nor is it intended to exclude other possibilities. For example, the operation depicted at block 1305 may precede the operations at any other block, and the operations at blocks 1302 and 1303 or 1303 and 1304 may occur substantially simultaneously with each other. Other sequences or combinations of the operations are contemplated.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. Therefore, it is intended that the invention be considered as limited only by the scope of the appended claims.

What is claimed is:

1. A method of producing a magnetic field having a controllable magnitude within a confined field space having a longitudinal axis, said method comprising:
    supplying a first magnetostatic potential to a first longitudinal pole face at a first longitudinal boundary oriented substantially normal to the longitudinal axis;
    supplying a second magnetostatic potential to a second longitudinal pole face at a second longitudinal boundary oriented substantially normal to the longitudinal axis;
    providing a plurality of lateral pole faces disposed along a lateral boundary intermediate the first and second longitudinal boundaries; each respective one of the plurality of lateral pole faces disposed in a respective lateral boundary plane oriented substantially normal to the longitudinal axis;
    supplying a respective magnetostatic potential to each respective one of the plurality of lateral pole faces; and
    for each respective one of the plurality of lateral pole faces, selecting a value of the respective magnetostatic potential in accordance with a position of the respective lateral boundary plane relative to the first and second longitudinal boundaries.

2. The method of claim 1 wherein said supplying the first, second, and respective magnetostatic potentials comprises connecting each of the pole faces through a magnetic conduit to a magnetostatic potential generator to provide selected values of magnetostatic potential.

3. The method of claim 2 wherein said supplying further comprises:
    identifying adjacent ones of the plurality of lateral pole faces connected to the magnetic conduit;
    coupling a magnetomotive force generator to the magnetic conduit between the respective lateral boundary planes of the adjacent pole faces; and
    generating a magnetomotive force having a value substantially equal to a difference in the respective magnetostatic potentials selected for the adjacent pole faces responsive to said selecting.

4. The method of claim 3 wherein said generating comprises driving an electric current through a current carrying conductor coiled around the magnetic conduit, and wherein the magnetomotive force is a product of a number of turns in the coil and an amplitude of the electric current.

5. The method of claim 4 wherein the value of the magnetomotive force is selectively adjustable in accordance with said driving.

6. The method of claim 3 wherein the value of the magnetomotive force is proportional to a distance between the respective lateral boundary planes of the adjacent pole faces.

7. The method of claim 1 wherein the first magnetostatic potential has a value of $P(L_a)$, the second magnetostatic potential has a value of $P(L_b)$, and the respective magnetostatic potential, $P(T_i)$, supplied to a respective one of the plurality of lateral pole faces has a value that is substantially equal to $$P(T_i) = \frac{P(L_a) \times sa_i + P(L_b) \times sb_i}{s}$$

where $sa_i$ is a distance between a respective lateral boundary plane, i, and the first longitudinal boundary, $sb_i$ is a distance between the respective lateral boundary plane, i, and the second longitudinal boundary, and s is a distance between the first and second longitudinal boundary surfaces.

8. The method of claim 1 further comprising:
    providing the first longitudinal pole face with a first contour;
    providing the second longitudinal pole face with a second contour;
    providing each of the plurality of lateral pole faces with a respective profile; and
    confining the field space using the first contour, the second contour, and the respective profiles.

9. The method of claim 8 further comprising substantially aligning the first contour, the second contour, and the respective profiles along the longitudinal axis.

10. The method of claim 8 wherein the respective profiles substantially correspond to a shape of the first contour and the second contour.

11. The method of claim 8 further comprising selecting the first contour, the second contour, and the respective profiles in accordance with physical dimensions of an object under test.

12. The method of claim 11 further comprising positioning the object under test within the field space, exposing a magnetic component of the object under test to the magnetic field, and controlling a magnitude of the magnetic field by proportionally controlling the first magnetostatic potential, the second magnetostatic potential, and the respective magnetostatic potentials.

13. The method of claim 12 wherein said exposing comprises sequentially exposing the magnetic component of the object under test to different magnetic fields.

14. An apparatus for producing a uniform magnetic field within a confined field space having a longitudinal axis; said apparatus comprising:
a first longitudinal pole piece, external to the field space, having a first longitudinal pole face with a first contour that forms a first longitudinal boundary surface oriented substantially normal to the longitudinal axis;
a second longitudinal pole piece, external to the field space, having a second longitudinal pole face with a second contour that forms a second longitudinal boundary surface oriented substantially normal to the longitudinal axis;
a plurality of lateral pole pieces, external to the field space and disposed along the longitudinal axis intermediate the first and second longitudinal boundary surfaces, each respective lateral pole piece having a respective lateral pole face with a respective lateral profile that forms a respective lateral boundary surface oriented parallel to the longitudinal axis in a respective lateral boundary plane that is substantially normal to the longitudinal axis;
a magnetic conduit to provide a low reluctance magnetic connection between said pole pieces; wherein said first longitudinal pole piece is magnetically coupled to a first end of said magnetic conduit, said second longitudinal pole piece is magnetically coupled to a second end of said magnetic conduit, and each of said plurality of lateral pole pieces is magnetically coupled to said magnetic conduit between said first and the second ends; and
a plurality of magnetomotive force generators, each coupled to said magnetic conduit and disposed between respective longitudinally adjacent pole pieces, each of said plurality of magnetomotive force generators connected to provide respective magnetostatic potentials to respective pole faces of said respective longitudinally adjacent pole pieces in accordance with positions of said respective pole faces along the longitudinal axis.

15. The apparatus of claim 14 wherein each of said plurality of magnetomotive force generators produces a magnetomotive force having a value that is proportional to a distance between said respective pole faces.

16. The apparatus of claim 15 wherein each of said plurality of magnetomotive force generators comprises a coil winding of current carrying conductor coiled around said magnetic conduit, and wherein the magnetomotive force is a product of a number of turns in said coil winding and an amplitude of an electric current driven through said current carrying conductor.

17. The apparatus of claim 14 wherein said magnetic conduit comprises a soft magnetic material and wherein said magnetic conduit is dimensioned in accordance with a magnetic permeability value and a magnetic saturation value associated with said soft magnetic material.

18. The apparatus of claim 14 wherein said magnetic conduit comprises a magnetic yoke having a respective extension connecting said magnetic yoke to a respective pole piece.

19. The apparatus of claim 18 wherein each of said plurality of magnetomotive force generators comprises a coil winding of current carrying conductor coiled around said magnetic yoke between adjacent extensions.

20. The apparatus of claim 19 wherein said coil windings are electrically connected in series and energized with an activation current.

21. The apparatus of claim 20 wherein a distance between each pair of adjacent pole faces is substantially uniform and wherein each of said coil windings has the same number of turns.

22. The apparatus of claim 14 wherein said pole pieces comprise a soft magnetic material; each of said pole pieces having a respective magnetic permeability value and a respective magnetic saturation value associated with said soft magnetic material.

23. The apparatus of claim 22 wherein each of said pole pieces is dimensioned in accordance with the respective values.

24. The apparatus of claim 23 further comprising a drive circuit to control said plurality of magnetomotive force generators as a function of a magnitude of the magnetic field to be produced.

25. The apparatus of claim 14 wherein a first magnetostatic potential supplied to said first longitudinal pole face has a value of $P(L_a)$, a second magnetostatic potential supplied to said second longitudinal pole face has a value of $P(L_b)$, and a respective magnetostatic potential, $P(T_i)$, supplied to a respective lateral pole face has a value that is substantially equal to $$P(T_i) = \frac{P(L_a) \times sa_i + P(L_b) \times sb_i}{s}$$

where $sa_i$ is a distance between a respective lateral boundary plane, i, and the first longitudinal boundary, $sb_i$ is a distance between the respective lateral boundary plane, i, and the second longitudinal boundary, and s is a distance between the first and second longitudinal boundary surfaces.

26. The apparatus of claim 14 wherein each said respective lateral profile is substantially aligned along the longitudinal axis.

27. The apparatus of claim 26 wherein each said respective lateral profile substantially corresponds to a shape of said first contour and said second contour and is substantially aligned with said first contour and said second contour along the longitudinal axis.

28. The apparatus of claim 14 wherein each said respective lateral profile forms a closed loop around the longitudinal axis.

29. The apparatus of claim 14 wherein said first contour, said second contour, and said lateral profiles are dimensioned in accordance with physical dimensions of an object under test.

30. The apparatus of claim 29 wherein at least one of said pole pieces is selectively removable from said magnetic conduit to allow the object under test to be positioned in the field space.

* * * * *

UNITED STATES PATENT AND TRADEMARK OFFICE
CERTIFICATE OF CORRECTION

| | |
|---|---|
| PATENT NO. | : 8,294,543 B2 |
| APPLICATION NO. | : 13/458535 |
| DATED | : October 23, 2012 |
| INVENTOR(S) | : Otto Voegeli |

It is certified that error appears in the above-identified patent and that said Letters Patent is hereby corrected as shown below:

Col. 8, line 44, after "system" insert -- (i.e., --.

Col. 10, line 43, after "Fy2." insert -- . . --.

Col. 10, line 45, after "Px2." insert -- . . -- and after "Py2." insert -- . . --.

Signed and Sealed this
First Day of January, 2013

David J. Kappos
*Director of the United States Patent and Trademark Office*